(12) United States Patent
Kawai

(10) Patent No.: US 6,518,823 B1
(45) Date of Patent: Feb. 11, 2003

(54) ONE-TIME PROGRAMMABLE LOGIC DEVICE

(75) Inventor: Eiji Kawai, Tokyo (JP)

(73) Assignee: Sony Computer Entertainment Inc. (JP)

( * ) Notice: Subject to any disclaimer, the term of this patent is extended or adjusted under 35 U.S.C. 154(b) by 0 days.

(21) Appl. No.: 09/645,091

(22) Filed: Aug. 24, 2000

(30) Foreign Application Priority Data

Aug. 31, 1999 (JP) .............................. 11-245933

(51) Int. Cl.⁷ .............................. G11C 17/16; G11C 7/24
(52) U.S. Cl. .......................................... 327/525; 326/38
(58) Field of Search ................................ 327/525, 143, 327/198; 365/225.7, 185.09, 86; 326/38, 525

(56) References Cited

U.S. PATENT DOCUMENTS

| | | | |
|---|---|---|---|
| 4,935,645 A | | 6/1990 | Lee ................. 327/88 |
| 5,270,983 A | | 12/1993 | Wuertz et al. ........... 365/225.7 |
| 5,491,444 A | * | 2/1996 | McClure .............. 327/525 |
| 5,539,692 A | * | 7/1996 | Kajigaya et al. ........... 365/201 |
| 5,663,902 A | * | 9/1997 | Bennett et al. ............. 365/96 |
| 6,014,052 A | * | 1/2000 | Coupe, II ............... 327/525 |
| 6,087,890 A | * | 7/2000 | Kim .................. 327/526 |
| RE36,952 E | * | 11/2000 | Zagar et al. ............ 327/525 |
| 6,246,243 B1 | * | 6/2001 | Audy ................. 327/525 |

FOREIGN PATENT DOCUMENTS

| | | | |
|---|---|---|---|
| EP | 0 378 306 A2 | 7/1990 | .......... H01L/23/58 |
| GB | 2 288 048 A | 10/1995 | .......... H01L/25/00 |
| TW | 78109441 | 9/1990 | |
| TW | 179758 | 3/1992 | |

* cited by examiner

Primary Examiner—Timothy P. Callahan
Assistant Examiner—Terry L. Englund
(74) Attorney, Agent, or Firm—Lerner, David, Littenberg, Krumholz & Mentlik, LLP

(57) ABSTRACT

An integrated circuit is provided, in which a one-time programmable logic device disables writing to a storage device on the user side once a current is passed therethrough. The integrated circuit has a flash memory operating as a storage device to/from which writing/erasure is possible when a read/write enable port is in a high level. When a power supply is applied to an external power supply input terminal, a fuse having a polysilicon interconnection pattern is blown after a set time period by the output of a step up regulator circuit. After the fuse is blown, the input of a buffer is fixed to a low level through a resistor, so that the read/write enable port of the flash memory as the output of an AND circuit is fixed to a low level and the flash memory becomes a read only memory.

15 Claims, 15 Drawing Sheets

ONE-TIME PROGRAMMABLE LOGIC DEVICE

BACKGROUND OF THE INVENTION

1. Field of the Invention

The present invention relates to an electric/electronic circuit preferably applicable to an integrated circuit device such as LSI (Large Scale Integrated Circuit) and capable of effectively preventing conversion of hardware in electric/electronic products, unlawful alteration or secondary use of software products or the like.

2. Description of the Related Art

In view of the foolproof and failsafe characteristics of electric/electronic products, conversion of hardware in electric/electronic products, alteration of software and the like are desirably rendered impossible on the user side.

Therefore, according to conventional techniques, special screws are employed for product cases, or software-wise countermeasure is provided in order to prevent conversion of such hardware in electric/electronic products or alteration or secondary use of software.

These devises could be effective to a certain extent for preventing conversion of hardware in electric/electronic products or alteration or secondary use of software, but the effect is not sufficient.

SUMMARY OF THE INVENTION

The present invention is directed to a solution to this problem, and it is an object of the present invention to provide an electric/electronic circuit device which can physically prevent conversion of hardware in an electric/electronic product and alteration, secondary use or the like of software with a simple structure.

It is another object of the invention to provide an electric/electronic circuit device which can prevent secondary use in the field once the user has used the product.

In the electric/electronic circuit device according to the present invention, the logical output of a logical output setting circuit is irreversibly fixed to a prescribed logical output based on a voltage applied to a particular terminal.

The use of the fixed logical output of the logical output setting circuit permits the operation of a logical element connected to the output side of the logical output setting circuit to be fixed.

Herein, the logical output setting circuit may have a (circuit) breaking element to be irreversibly disconnected based on a voltage applied on a particular terminal.

In this case, a boosting circuit is provided between the particular terminal and the breaking element so that the breaking element can be easily disconnected by the output of the boosting circuit if a voltage applied to the particular terminal is relatively low.

It is desirable that the boosting circuit is driven by a power-on reset circuit to set the boosting circuit to an operation state for a prescribed time period after a voltage is applied to the particular terminal, since the power consumption by the boosting circuit can be limited to a prescribed period.

If the boosting circuit is connected with a power consumption limiting circuit to reduce or eliminate the power consumption by the boosting circuit in response to detection of the disconnection of the breaking element, the power consumption by the electric/electronic circuit device can be reduced after the breaking element is disconnected.

The breaking element is disconnected by the output of the boosting circuit set to an operation state for a prescribed time period by the power-on reset circuit after a voltage is applied to the particular terminal. The boosting circuit is connected with a power consumption limiting circuit which reduces or eliminates the power consumption by the boosting circuit in response to detection of the disconnection of the breaking element, so that the power consumption by the boosting circuit can be reduced or eliminated in a normal state after the breaking element is disconnected.

When the electric/electronic circuit device is formed by an integrated circuit, the breaking element can be integrally formed by a silicon interconnection pattern.

If the particular terminal is a power supply input terminal for the electric/electronic circuit device and the user uses the electric/electronic circuit device for the first time, the logical output of the logical output setting circuit will be fixed.

An electric/electronic circuit device according to the present invention includes a logical output setting circuit having a logical output irreversibly fixed to a prescribed logical output when a voltage is applied to a particular external terminal and an electrically writable and erasable storage device connected to the output side of the logical output setting circuit.

According to the present invention, by the logical output of the logical output setting circuit, the operation of the electrically writable and erasable storage device can be defined.

More specifically, an external terminal for reading/writing control is connected to the reading/writing control input of the storage device, and reading/writing from/to the storage device can be controlled by using the external terminal for reading/writing control before a voltage is applied to the particular external terminal. As a result, the device can be used such that writing/erasure to the storage device can be performed as desired before the logical output setting circuit is fixed to a prescribed logical output, while after it is fixed to a prescribed logical output, writing/erasure is disabled.

Alternatively, the reading/writing control input of the storage device may be connected with an internal terminal for reading/writing control, and reading/writing from/to the storage device can be controlled by using the internal terminal for reading/writing control before a voltage is applied to the particular external terminal. As a result, for example reuse (writing/erasure) can be executed as many times as necessary on the side of the manufacturer of the electric/electronic circuit device.

More specifically, when a voltage is actually applied to a particular external terminal, the storage device can be used only as a read only memory by a fixed prescribed logical output of the logical output setting circuit.

The logical output setting circuit includes a breaking element to be irreversibly disconnected based on a voltage applied to the particular external terminal.

Also in this case, a boosting circuit is provided between the particular external terminal and the breaking terminal, so that the breaking element can be easily disconnected by a relatively high voltage output of the boosting circuit even if the voltage applied to the particular external terminal is relatively low.

It is desirable that the boosting circuit is driven by a power-on reset circuit to set the boosting circuit to an operation state for a prescribed time period after a voltage is applied to the particular external terminal, since the power consumption by the boosting circuit can be limited to the prescribed time period.

If the boosting circuit is connected with a power consumption limiting circuit to reduce or eliminate the power consumption by the boosting circuit in response to detection of the disconnection of the breaking element, the power consumption by the electric/electronic circuit device can be reduced after the breaking element is disconnected.

The breaking element is disconnected by the output of the boosting circuit set to an operation state by the power-on reset circuit for a prescribed time period after a voltage is applied to the particular external terminal, and the boosting circuit is connected with a power consumption limiting circuit to reduce or eliminate the power consumption by the boosting circuit in response to detection of the disconnection of the breaking element, so that the power consumption by the boosting circuit can be reduced or eliminated in a normal state after the breaking element is disconnected.

If the electric/electronic circuit device is formed by an integrated circuit, the breaking element can be formed by a silicon interconnection pattern.

The particular external terminal may be a power supply input terminal for the electric/electronic circuit device, so that once the user has used the device, the logical output setting circuit has its logical state fixed and cannot be subjected to secondary use in the field.

Furthermore, the electric/electronic circuit device according to the present invention may be formed to irreversibly fix the logical output of the logical output setting circuit to a prescribed logical output by supplying a current rather than applying a voltage to the particular terminal.

Similarly, the electric/electronic circuit device according to the present invention may be formed to have a logical output setting circuit having a logical output irreversibly fixed to a prescribed logical output by supplying a current rather than applying a voltage to the particular external terminal and an electrically writable/erasable storage device connected to the output side of the logical output setting circuit.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

One embodiment of the present invention will be now described in conjunction with the accompanying drawings.

Figure 1:
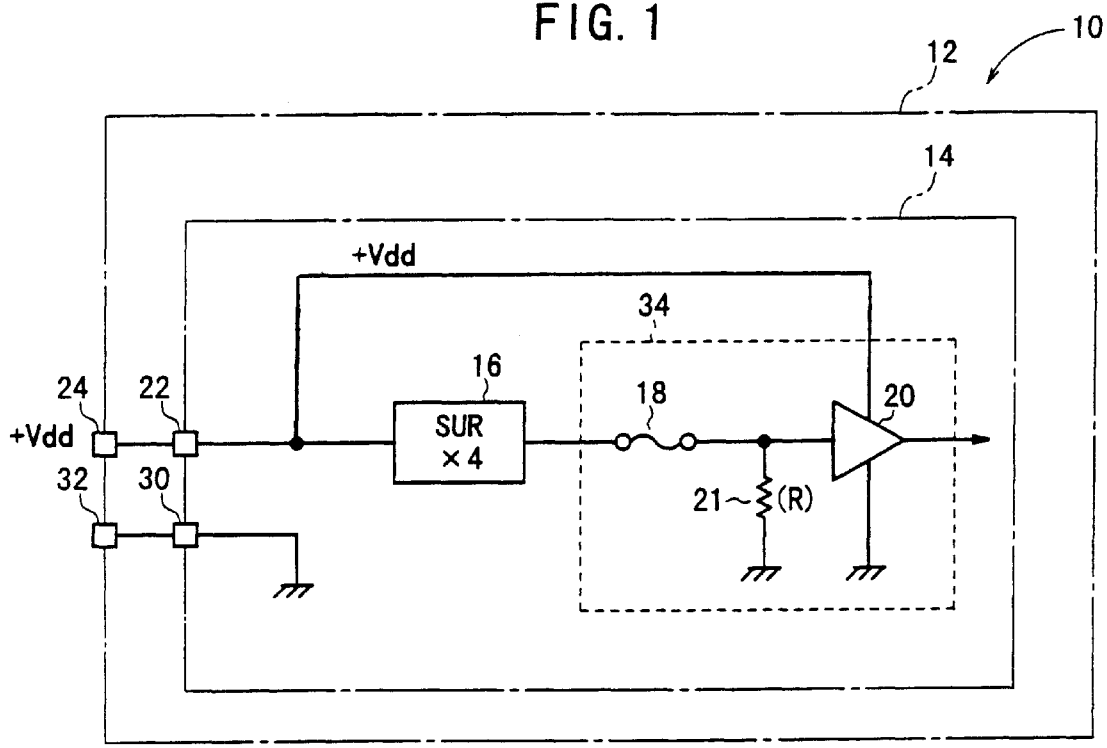
FIG. 1 is a circuit block diagram showing the configuration of an integrated circuit to which one embodiment of the present invention is applied.

FIG. 1 shows the configuration of an integrated circuit (IC) 10 such as an LSI to which an electric/electronic circuit device according to one embodiment of the present invention is applied. The integrated circuit 10 includes an IC chip 14 basically formed by a silicon wafer stored in a plastic package 12.

On the IC chip 14, there are integrated elements including a step up regulator circuit (hereinafter referred to as "SUR circuit") 16 serving as a boosting circuit to raise a supplied voltage to a desired higher voltage, a fuse 18 serving as a breaking element connected in series to the SUR circuit 16, a buffer 20 connected in series to the fuse 18, and a resistor 21 having a resistance value R (R=100 [Ω]) and connected between the common contact of the fuse 18 and the buffer 20 and ground.

In the integrated circuit 10, the fuse 18, the resistor 21, and the buffer 20 form a logical output setting circuit 34.

Note that in the following description, for the ease of understanding, the input impedance (input resistance) of each of the SUR circuit 16 and the buffer 20 is infinite and the output impedance (output resistance) is zero.

The SUR circuit 16 described above basically corresponds to the configuration of a switching regulator including an oscillator, a transformer connected to the oscillator, a smoothing circuit connected to the transformer to output a DC current, and a feedback circuit to return the output of the smoothing circuit to the oscillator for adjusting the oscillation intensity.

The SUR circuit 16 has an input terminal connected to a bonding pad (hereinafter simply as the "pad" or "terminal") 22 serving as a terminal. The pad 22 is connected to an external power supply input terminal 24 as a particular terminal through a bonding wire such as a gold or aluminum wire. In this embodiment, a voltage Vdd (also referred to as "power supply Vdd") externally applied to the external power supply input terminal 24 is for example +3 V (Vdd=+3 [V]).

In the integrated circuit 10 as shown in FIG. 1, the SUR circuit 16 is designed to have a gain of four, and the voltage Vdd of +3 V applied to an input node is boosted to +12 V to be generated. at an output node.

The buffer 20 generates a low level L (L=0 [V]) as a logical output when an input voltage is a low level L voltage of zero V, and generates a high level H (H=+3 [V]) as a logical output when the input voltage is for example a high level voltage of +2.1 V or higher.

The ground of the IC chip 14 is connected to an external ground terminal 32 through a pad 30 serving as a ground terminal and a bonding wire.

Note that in each circuit in the following description, reference characters are basically omitted for the voltages (power supply) Vdd and grounds in the buffer 20 and logic circuits which are not shown for the sake of simplicity.

The integrated circuit 10 according to the embodiment basically has the above configuration.

Figure 2:
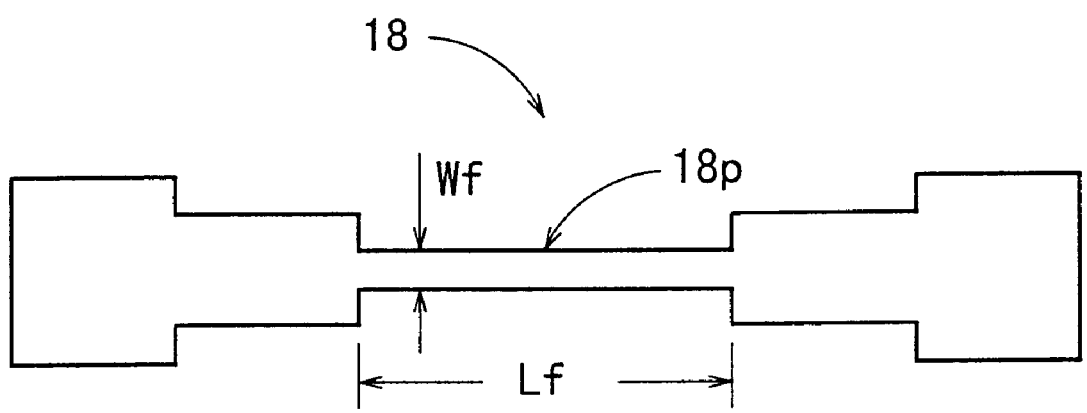
FIG. 2 is a pattern diagram for use in illustration of a specific structure of a fuse.

FIG. 2 shows a specific example of the fuse 18 as a breaking element. The fuse 18 has a polysilicon interconnection pattern 18p having a small line width, and the line width Wf, length Lf and the thickness are determined so that the fuse melts to be disconnected (fusing or breaking) in response to a current in a prescribed level or higher passed therethrough. In this embodiment, a fusing current (also called breaking current) "If" is set to 120 mA (If=120 [mA]).

In the integrated circuit 10 as shown in FIG. 1, the fuse 18, the resistor 21, and the buffer 20 form the logical output setting circuit 34 as described above. The output terminal of the buffer 20 as the output stage of the logical output setting circuit 34 may be connected with various logic circuits.

Figure 3:
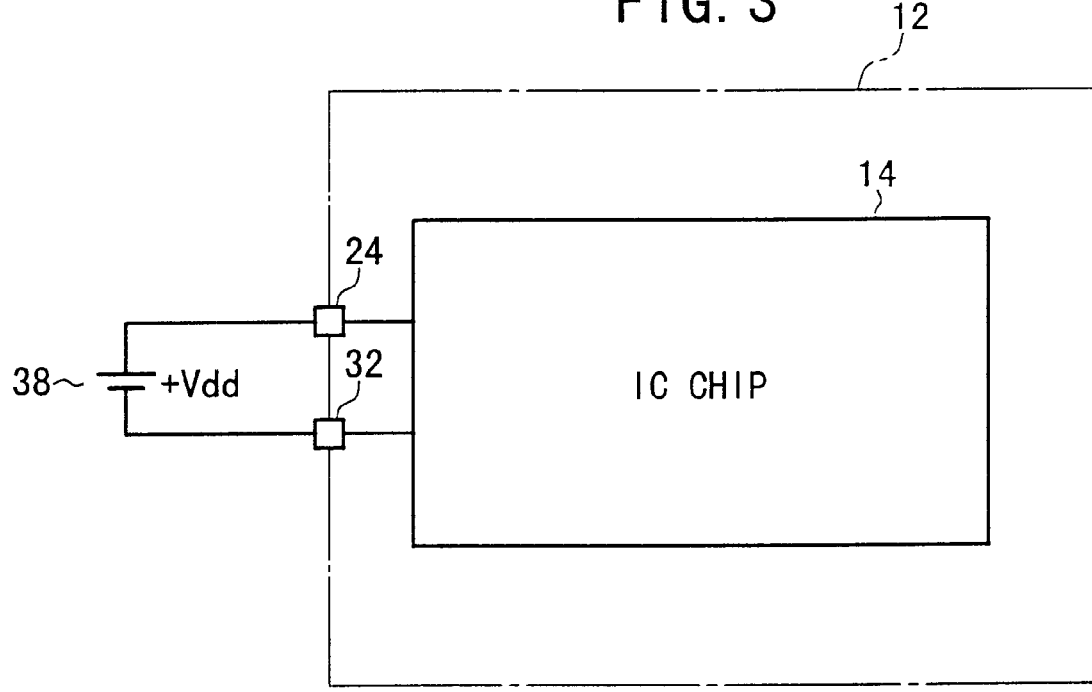
FIG. 3 is a schematic diagram showing the state in which a power supply is provided to an integrated circuit.

In the integrated circuit 10 having this configuration, when an external DC power supply 38 having a voltage Vdd of +3 V is connected between the external power supply input terminal 24 as a particular terminal or a particular external terminal and the external ground terminal 32 as shown in FIG. 3, the voltage Vdd of +3 V is applied to the input terminal of the SUR circuit 16 through the external power supply input terminal 24 and the terminal 22 (see FIG. 1), and a boosted voltage four times larger, i.e., a voltage of +12 V is generated on the output side of the SUR circuit 16.

Thus, a current produced by dividing the boosted voltage of +12 V by the resistance value R of the resistor 21 (current I=12 [V]/100 [Ω]=120 [mA]=If) is passed across the fuse 18 for blowing.

In this case, during the short period from the application of the external DC power supply 38 of the voltage Vdd to the blowing of the fuse 18, a high level H (H=+3 [V]) is output from the buffer 20, but once the fuse 18 is blown to open the region between the terminals of the fuse 18, the input of the buffer 20 is fixed to the ground level, in other words to a low level L through the resistor 21. Therefore, the output level of the buffer 20 is permanently fixed in the low level (L=0 [V]) after the fuse 18 is blown.

Stated differently, the integrated circuit 10 according to the embodiment has the fuse 18 serving as a breaking element to be irreversibly blown based on the voltage Vdd applied to the external power supply input terminal 24 as a particular terminal (particular external terminal). When the fuse 18 is blown, the logical output of the logical output setting circuit 34 is irreversibly fixed to a prescribed logical output, the low level L in this case based on the output level of the buffer 20.

If the user in the field gets the integrated circuit 10 having such a configuration from the manufacturer or factory and a current is passed across the integrated circuit 10 for the first time on the user side, in other words once the user uses the circuit, the logical state of a logic circuit (not shown) connected to the output side of the buffer 20 is physically fixed based on the fixed logical output of the buffer 20 forming the logical output setting circuit 34.

Therefore, in the integrated circuit 10 having such a configuration, the logic circuit connected to the output side of the buffer 20 cannot be used on the user side, in other words the secondary use of the circuit is disabled.

In connection with FIG. 1, the example suitable for the integrated circuit 10 as an electric/electronic circuit device is described, but the present invention is not limited to the integrated circuit 10, but may be applied to an electric/electronic circuit device formed by discrete parts.

Figure 4:
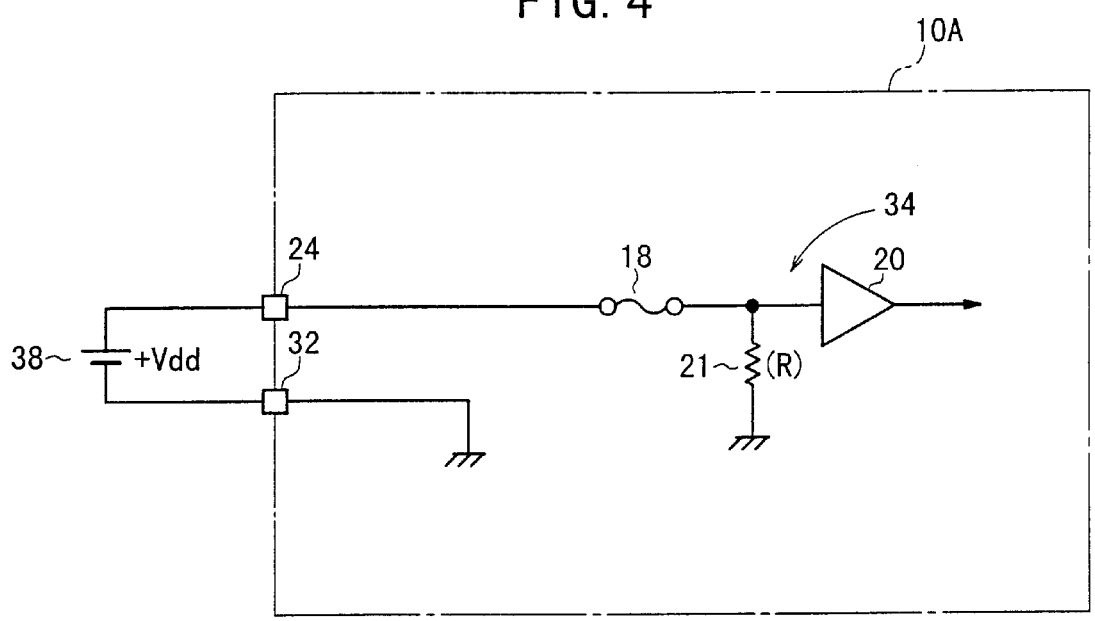
FIG. 4 is a circuit block diagram showing the configuration of another embodiment of the present invention.
Figure 5:
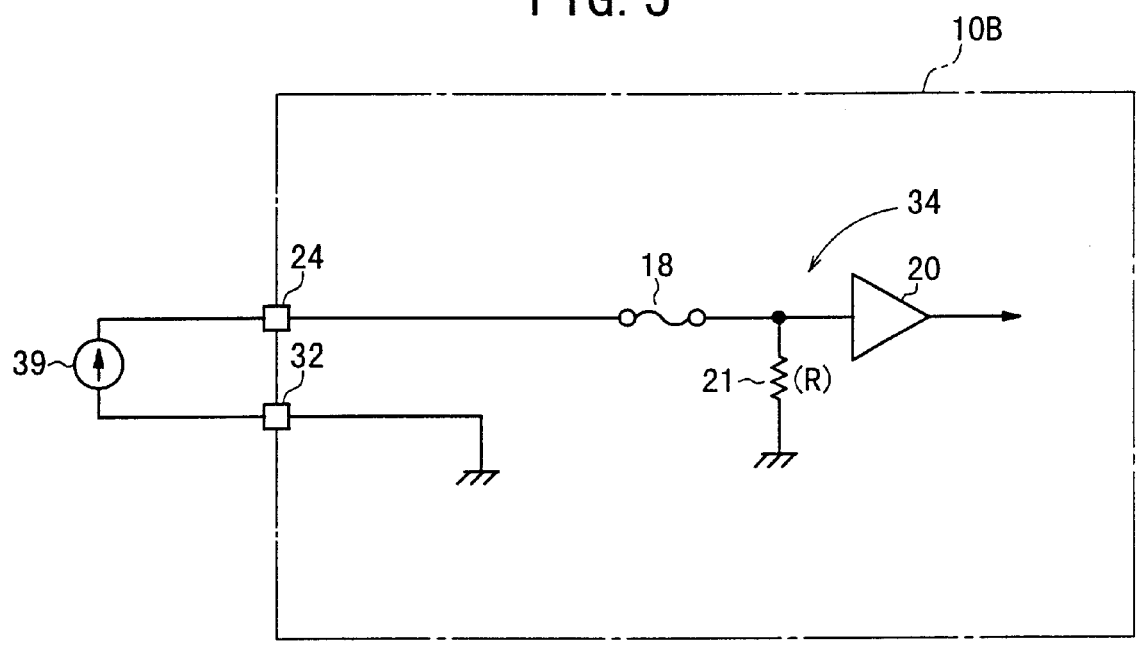
FIG. 5 is a circuit block diagram showing the configuration of yet another embodiment of the present invention.

In the description in connection with FIG. 1, the SUR circuit 16 is used to blow the fuse 18, but as in the configuration of an electric/electronic circuit device 10A shown in FIG. 4, the fuse 18 may be directly blown only with the external DC power supply (voltage source) 38. Also as shown in FIG. 5, an electric/electronic circuit device 10B to directly blow the fuse by using an external DC current source 39 may be employed. Note that in the electric/electronic circuit devices 10A and 10B as shown in FIGS. 4 and 5, elements corresponding to those in the integrated circuit 10 shown in FIG. 1 are denoted by the same reference characters for the sake of simplicity and understanding. In the electric/electronic circuit device 10B shown in FIG. 5, a current booster may be provided between the external power supply input terminal 24 and the fuse 18.

Hereinafter, in circuits or devices to be described with reference to figures, the same or corresponding elements as those already described with a preceding figure are denoted with the same reference characters and a detailed description thereof is not provided.

Figure 6:
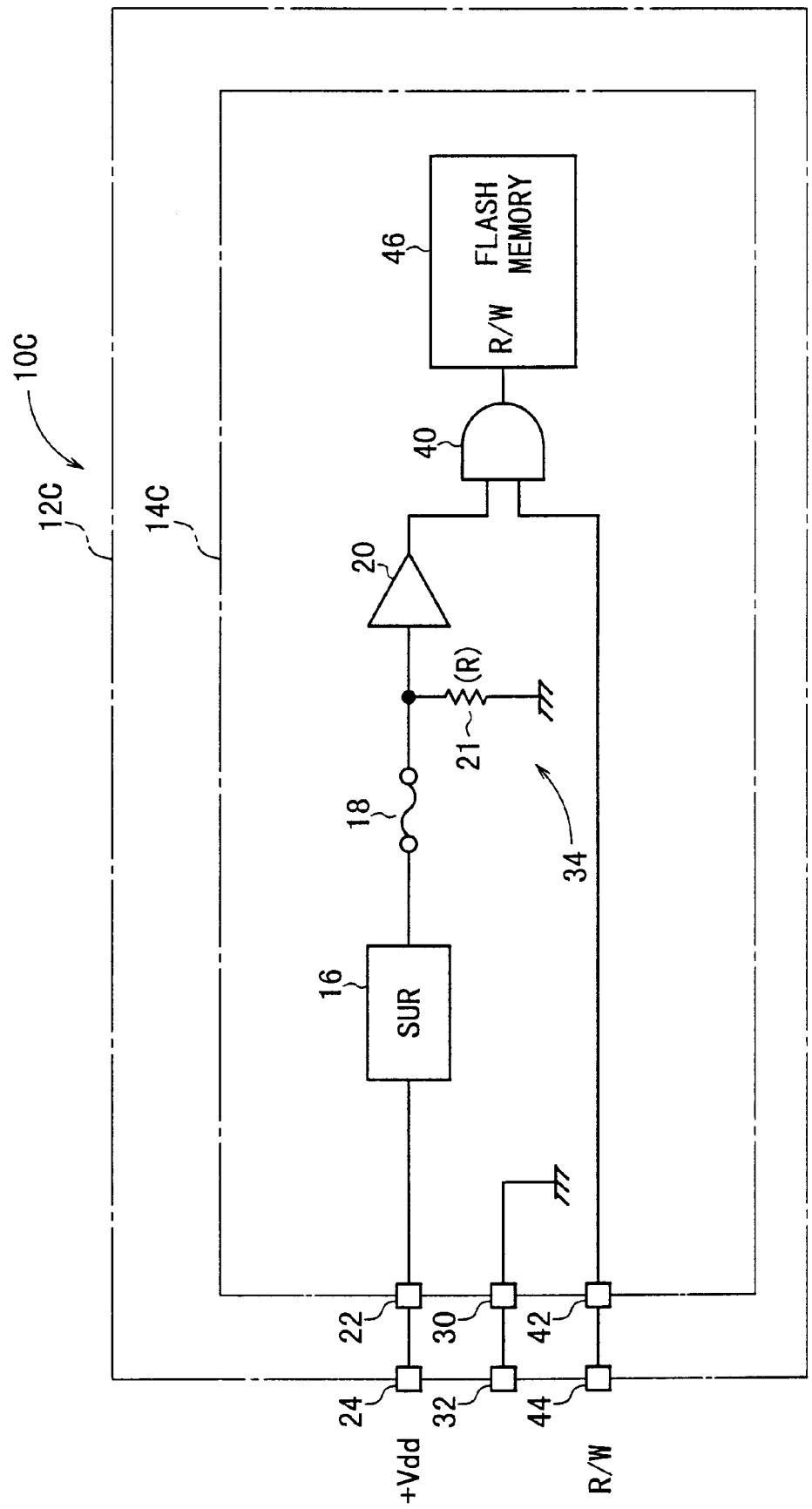
FIG. 6 is a circuit block diagram showing the configuration of an example of a virtual integrated circuit for use in illustration of the operation.

FIG. 6 shows the configuration of a virtual integrated circuit 10C for use in illustration of the operation.

In this integrated circuit 10C, the output of the buffer 20 in the logical output setting circuit 34 forming the semiconductor chip 14C is connected to one input node of an AND circuit (logical product circuit) 40, and the other input node of the AND circuit 40 is connected to the external terminal 44 of a plastic package 12 through a bonding pad 42. The output of the AND circuit 40 is connected to a read/write enable port R/W as an input for reading/writing control for a flash memory 46 which is an electrically writable/erasable storage device.

The address port, data port and other control ports of the flash memory 46 are connected with a CPU (Central Processing Unit) and/or a DMA (Direct Memory Access) IC through an address bus, a data bus and a control bus which are not shown.

In the virtual integrated circuit 10C as shown in FIG. 6, when a logical level (high level) H is supplied to the read/write enable port R/W of the flash memory 46, writing/erasure to/from the flash memory 46 is enabled (which is referred to as a writing mode). Meanwhile, when a logical level (low level) L is supplied, the flash memory 46 attains a reading mode to function as a read-only memory.

Assuming that the output level of the buffer 20 is virtually in a high level H, one input node of the AND circuit 40 attains a high level H, and therefore a read/write command signal R/W supplied to the external terminal 44 of the package 12C as it is functions as a command signal to select the writing mode or the reading mode to the flash memory 46 through the other input node of the AND circuit 40. At this time, the external terminal 44 functions as an external write/read enable terminal (external terminal for reading/writing control). described above, when the external DC power supply 38 having the voltage Vdd of +3 V is connected between the external power supply input terminal 24 and the external ground terminal 32, both serving as an external terminal, the fuse 18 is blown by the output high voltage of the SUR circuit 16, and the one input node of the AND circuit 40 connected to the output side of the buffer 20 is irreversibly fixed to a low level L, so that the read/write enable port R/W of the flash memory 46 connected to the output terminal of the AND circuit 40 is fixed to the reading mode. Thereafter, the read/write command signal R/W supplied to the external terminal 44 for reading/writing control is invalidated.

In the integrated circuit 10C having such a circuit configuration, provided that the output of the buffer 20 may be virtually pulled to a high level H before a voltage is applied to the external power supply input terminal 24 as a particular external terminal, the read/write command signal R/W to be supplied to the external terminal. 44 for reading/writing control can be used to control reading/writing from/to the flash memory 46. However, once the external DC power supply 38 is connected to the external power supply input terminal 24, the fuse 18 is blown by the voltage Vdd. When the fuse 18 is blown, the logical output of the logical output setting circuit 34 is irreversibly fixed to a low level L, and writing to the flash memory 46 will never be enabled. The flash memory 46 may be used only as a read-only memory thereafter.

Meanwhile, in the virtual integrated circuit 10C as shown in FIG. 6, once the external DC power supply 38 is connected between the external power supply input terminal 24 and the external ground terminal 32 of the package 12C, writing will not be enabled to the flash memory 46, and therefore a special writing structure must be provided in a manner invisible to the user in the initial writing at a factory or the like.

Therefore, in the stage of a wafer before assembling into a package, an internal pad for probing could be provided at the read/write enable port R/W of the flash memory 46 connected to the output node of the AND circuit 40, and an internal pad could also be provided such that a power supply is provided only to the flash memory 46 in order to perform writing control. However, higher productivity would be achieved if the initial writing control is executed on the factory side in the final product state of an assembled, so-called semiconductor package 12.

Figure 7:
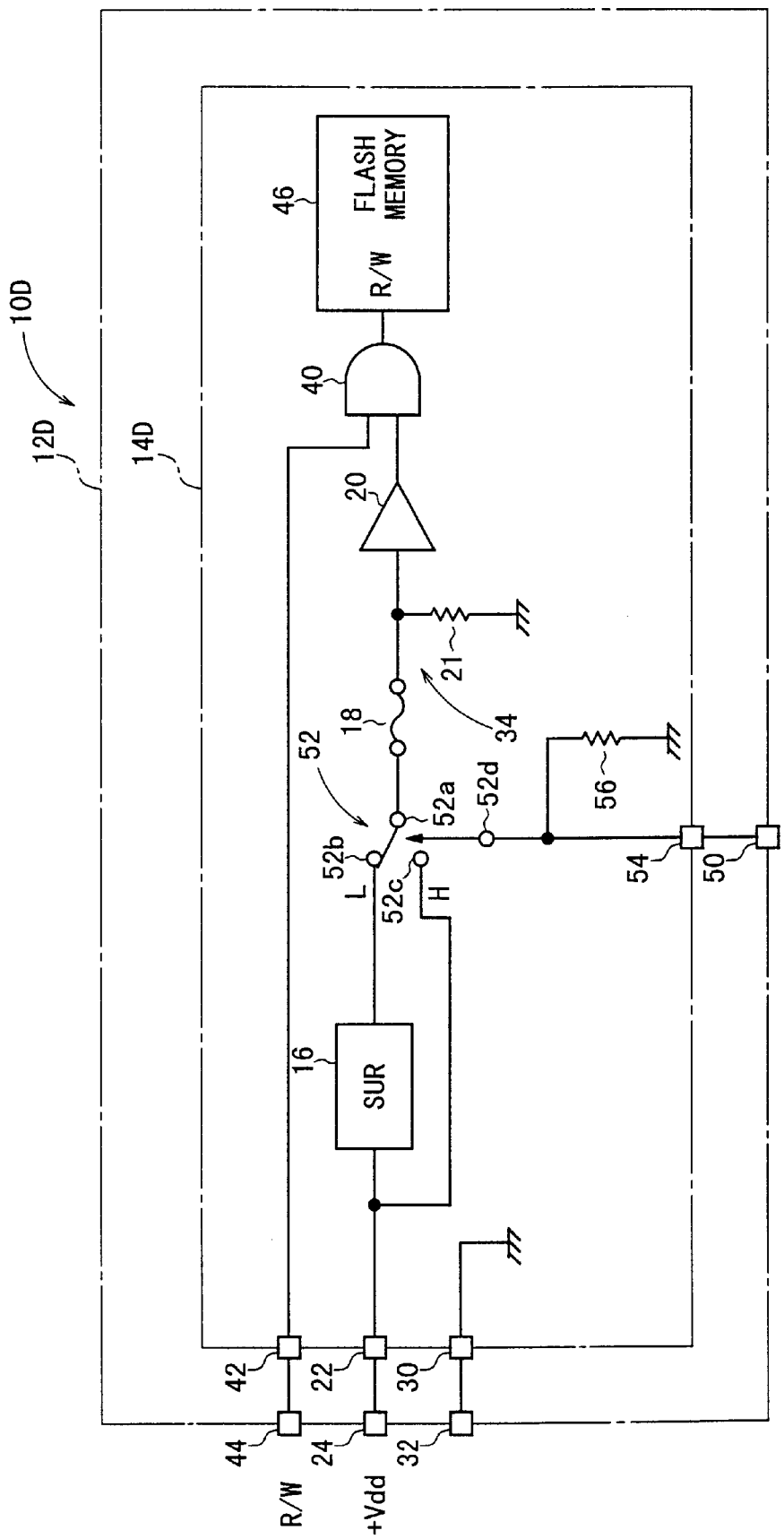
FIG. 7 is a circuit block diagram showing the configuration of an integrated circuit which allows a storage device to be written by an external terminal input before a fuse is disconnected.

FIG. 7 shows the configuration of an integrated circuit 10D which allows initial writing control even after packaging by using an external terminal 50 for reading/writing control.

More specifically, in the integrated circuit 10D, a semiconductor switch 52 on a two-contact-per-circuit basis is provided between the SUR circuit 16 and the fuse 18 in a semiconductor chip 14D, a common contact 52a connected with a moving contact is connected to the fuse 18, one fixed contact 52b is connected to the output of the SUR circuit 16 and the other fixed contact 52c is connected to a pad 22 connected to the external power supply input terminal 24. Furthermore, a switching control terminal 52d to switch the common contact 52a of the switch 52 is connected to a pad 54 serving as an internal terminal for reading/writing control, and the pad 54 and the external terminal 50 for initial reading/writing control of the package 12D are connected by wire bonding. Note that a pull-down resistor 56 having a resistance value of 100 kΩ is connected between the common connection node of the switching control terminal 52d of the switch 52 and the pad 54 and ground.

Herein, regarding the switch 52, when a high level H is applied to the switching control terminal 52d, the common contact 52a and the fixed contact 52c are connected, while when the switching control terminal 52d is in a low level L, the common contact 52a and the fixed contact 52b on the output side of the SUR circuit 16 are connected.

In the integrated circuit 10D having such a configuration, as will be described in detail, before the packaging of the IC chip 14D, the pads 22, 30, 42 and 54 each serving as an internal terminal can be used for initial writing, and after the packaging of the IC chip 14D, the terminals 24, 32, 44 and 50 each serving as an external terminal can be used for initial writing.

More specifically, at the time of initial writing at a factory or the like, while a high level H is applied to the external terminal 50 for initial reading/writing control, an external DC power supply Vdd of 3 V is applied to the external power supply input terminal 24. Thus, the common contact 52a of the switch 52 is immediately connected to the side of the fixed contact 52c which is not on the output side of the SUR circuit 16.

The fuse 18 is provided with a power supply voltage Vdd of +3 V through the external power supply input terminal 24, the pad 22 and the switch 52. At this time, the current passed through the fuse 18 is produced by dividing the power supply voltage Vdd by the resistance value R of the resistor 21, in other words, 3 V/100 Ω=30 mA. The polysilicon pattern of the fuse 18 is not blown by the current of 30 mA, but is blown by 120 mA, so that the fuse 18 will not be disconnected and the high level H of the power supply voltage Vdd is input to the input of the buffer 20.

Thus, the output side node of the buffer 20 in the AND circuit 40 is pulled to a high level H. so that the read/write enable port R/W as a reading/writing control input port for the flash memory 46 is supplied with the level of a command signal R/W supplied to the external terminal 44 for reading/writing control as it is. If for example the command signal R/W attains a high level H, a writing processing can be performed to the flash memory 46.

Note that the external terminal 50 for initial reading/writing control is an external terminal of the package 12D as is the case with the integrated circuit 10D, but only the pad 54 on the IC chip 14 may be provided, without providing the external terminal 50 for initial reading/writing control outside the package 12D, as a so-called bonding option. As a result, the external terminal 50 for reading/writing control may be completely invisible from the user. In this case, since the pad 54 functions as an internal terminal for initial reading/writing control, initial writing at a factory or the like can be performed by probing to the pads 54, 42, 22, 30 and the like before and after the step of wafer test to the IC chip 14.

Figure 8:
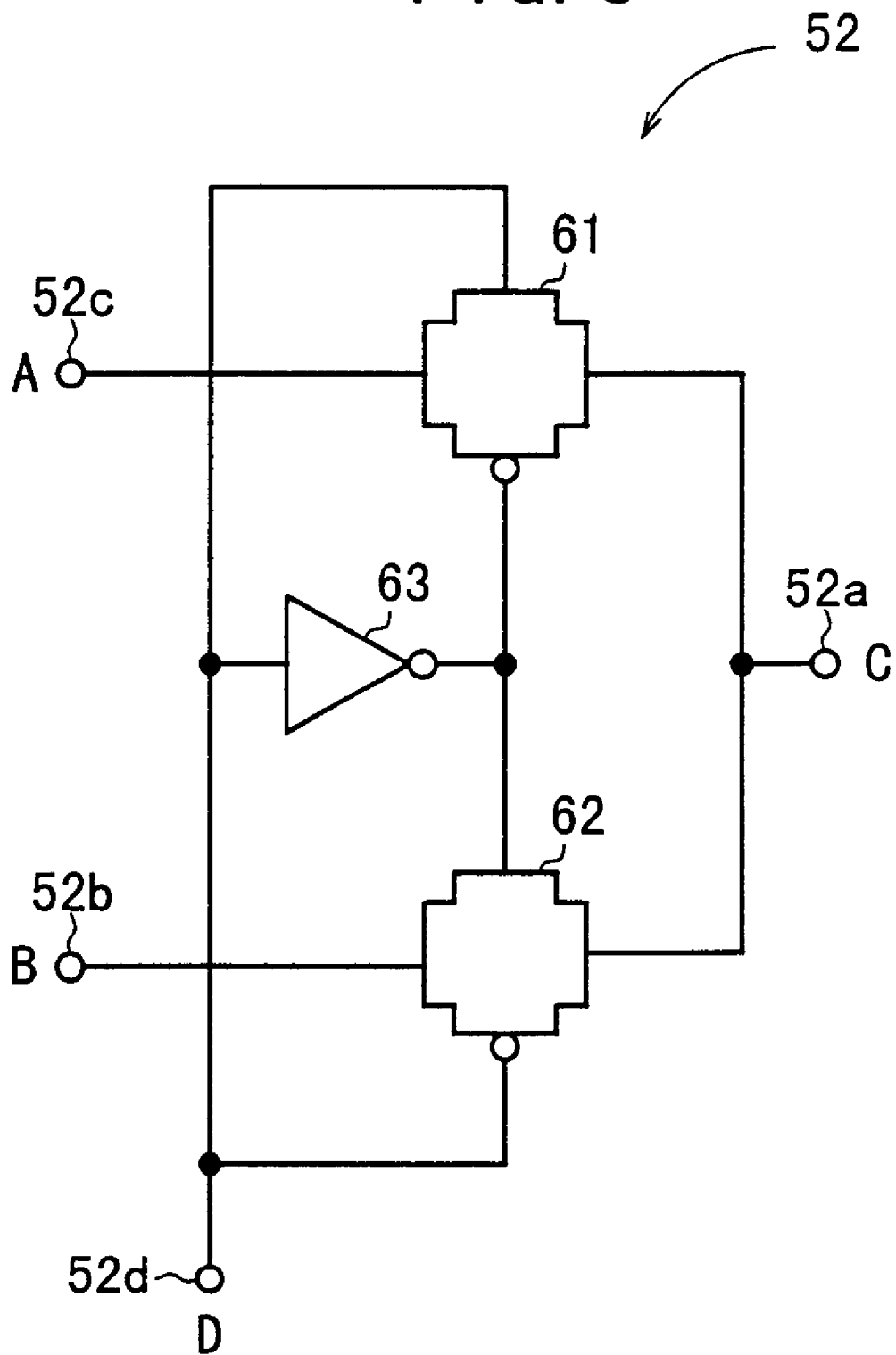
FIG. 8 is a circuit diagram showing the configuration of a multiplexer as shown in FIG. 7.

FIG. 8 shows the circuit configuration of a specific example of the switch 52. The switch 52 has a multiplexer configuration including transmission gates 61 and 62 each formed by a CMOS (PMOS+NMOS) transistor with small power consumption and an inverter 63.

Figure 9:
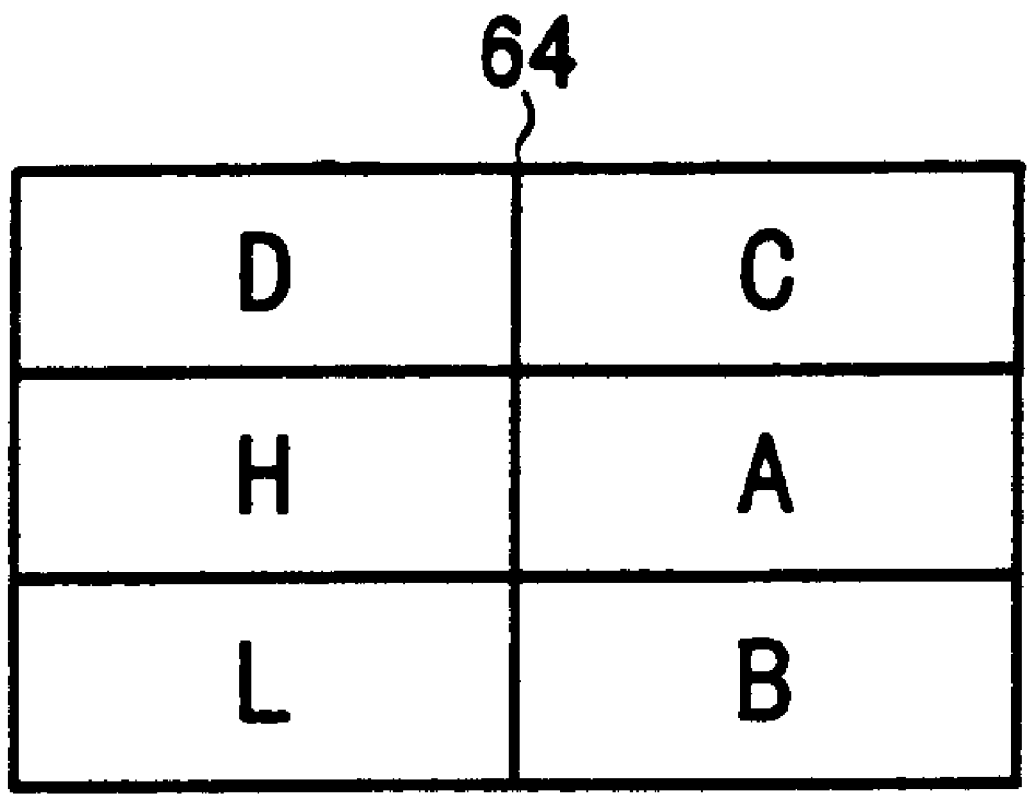
FIG. 9 is a truth table showing the operation of the multiplexer as shown in FIG. 8.

FIG. 9 shows a truth table 64 representing the operation of the switch 52 shown in FIG. 8. The table shows the logical relation of inputs A and B and an output C relative to a control input D where a high level H or low level L control input to be applied to the switching control terminal 52d is D, the input to the fixed contact 52c is A, the input to the fixed contact 52b is B and the output appearing at the common contact 52a is C. More specifically, when the control input D is in a high level H, the input A is the output C, while when the control input D is in a low level L, the input B is the output C.

The integrated circuit 10D having such a configuration may be incorporated into a cartridge for example in a portable game machine employing a cartridge type storage device. In this case, if a flash memory is used as a memory for storing software in the cartridge, the content of the flash memory can be protected from being rewritten for secondary use on the user side. Note that in the cartridge type storage device, the flash memory is used rather than a ROM (Read Only Memory) because software may be subjected to writing just before the shipment depending upon the demand, so that the stock of cartridges written with particular software can be minimized and hence the sales efficiency may be improved.

Figure 10:
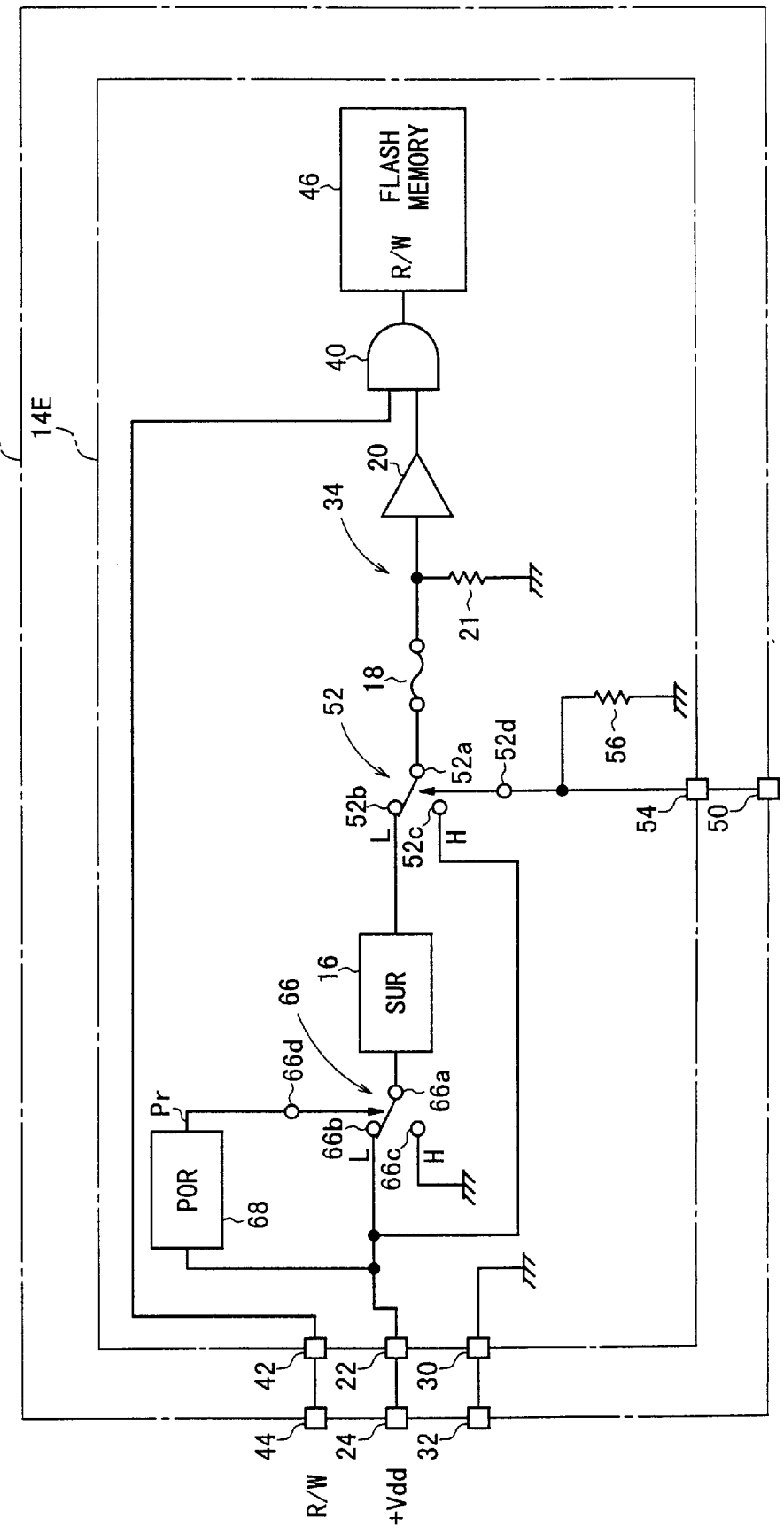
FIG. 10 is a circuit block diagram showing the configuration of an integrated circuit directed to saving of the power consumption after the disconnection of a fuse by employing a power-on reset circuit.

FIG. 10 shows the configuration of an integrated circuit 10E according to another embodiment of the present invention. The integrated circuit 10E solves the disadvantage associated with the integrated circuit 10D as shown in FIG. 7, in other words the disadvantage that a power supply voltage Vdd continues to be applied to the SUR circuit 16 during the on state of the integrated circuit 10D after the fuse 18 is blown, and power is constantly consumed in the SUR circuit 16. More specifically, the embodiment addresses the disadvantage associated with the use of the integrated circuit 10D for equipment driven by a battery such as mobile equipment, i.e., the disadvantage that the use of the battery reduces the operation period.

The integrated circuit 10E as shown in FIG. 10 is a circuit to operate the SUR circuit 16 only for a prescribed time period after an external DC power supply 38 (power supply Vdd) is turned on through an external power supply input terminal 24 provided at a package 12E, and is given as an example in which the power consumption is saved in the SUR circuit 16 in normal use.

More specifically, in the integrated circuit 10E, a semiconductor switch 66 having the same structure as the switch 52 described above is provided between a pad 22 and the SUR circuit 16, while a power-on reset circuit (POR circuit) 68 to supply a switching control signal Pr to a switching control terminal 66d is provided between the switching control terminal 66d of the switch 66 and the pad 22. The POR circuit 68 and the switch 66 form a power consumption limiting circuit.

Figure 11:
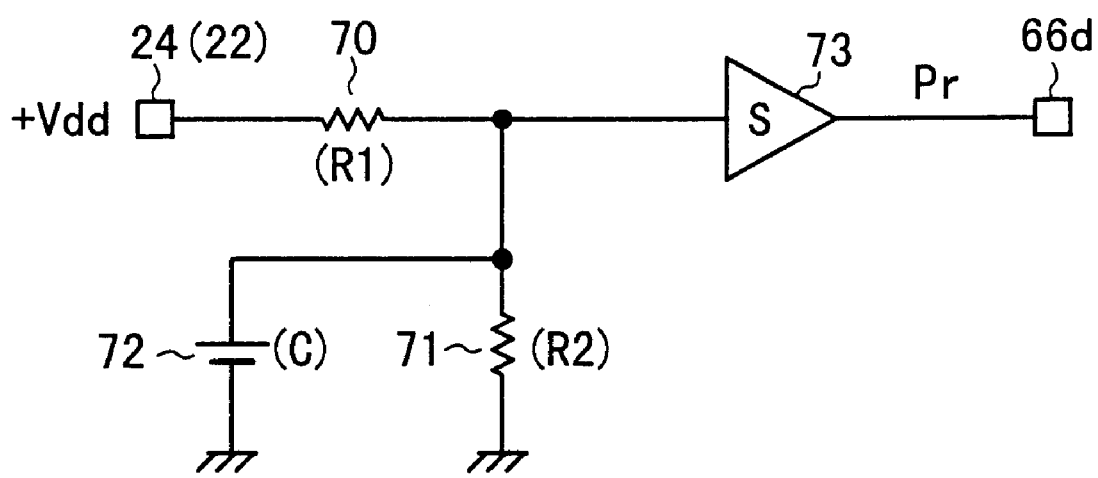
FIG. 11 is a circuit diagram showing the configuration of an example of a power-on reset circuit.

FIG. 11 shows a specific example of the POR circuit 68. When a power supply voltage Vdd is applied to the pad 22 through an external power supply input terminal 24, charges are gradually stored in a capacitor 72 such as an externally attached electrolytic capacitor. It takes a prescribed time period determined by a time constant (which can be determined by the capacitance C of the capacitor 72) for an input node in a Schmitt trigger type buffer 73 to reach an intermediate voltage {Vdd×R2/(R1+R2)} defined by the ratio of the resistance values R1 and R2 of resistors 70 and 71, respectively. switch 66 from chattering.

Figure 12:
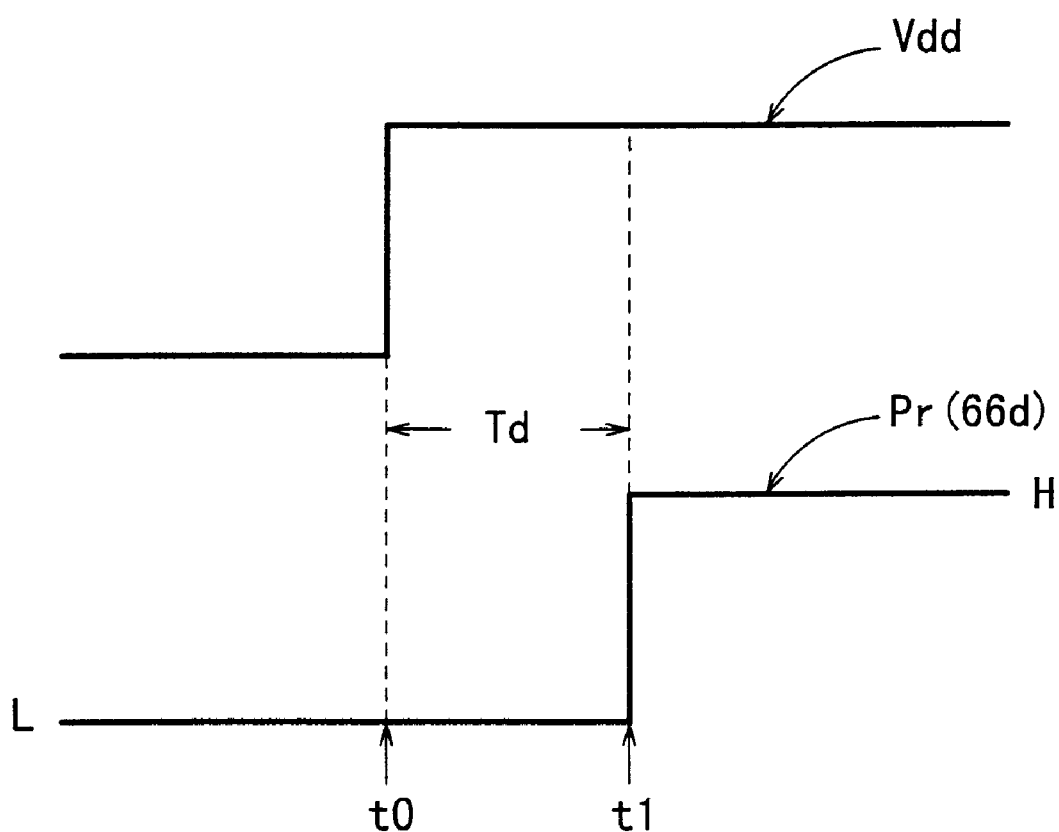
FIG. 12 is a timing chart for use in illustration of the operation of the integrated circuit as shown in FIG. 10.

In this case, as shown in the timing chart in FIG. 12, generated at the switching control terminal 66d of the switch 66 is a switching control signal Pr, i.e., a power-on reset signal which transits from a low level L to a high level H at the time point t1 after a prescribed time period (also referred to as "power-on reset period") Td from the time point t0 at which the power supply Vdd is applied to the external power supply input terminal 24.

Here, regarding the switch 66, during the prescribed time period Td after the power supply Vdd is turned on, the common contact 66a and the fixed contact 66b are connected by the switching control signal Pr at a low level L, while when the switching control signal Pr attains a high level H, the common contact 66a is switched to the fixed contact 66c in the ground potential level.

In the integrated circuit 10E, the time period until the fuse 18 is disconnected is set to a time period shorter than the power-on reset period Td, so that the fuse 18 can be disconnected during this power-on reset period Td, and after the power-on reset period Td, in other words, after the power-on reset is cancelled, the input node of the SUR circuit 16 is grounded through the switch 66. As a result, after the power-on reset Td is cancelled, the power consumption by the SUR circuit 16 can be stopped.

In the event that the fuse 18 should not be disconnected by current passed in the first power-on reset period Td, the fuse 18 will be highly probably disconnected by current passed for the second or third time. In such a case, after each power-on reset period Td elapses, the power consumption in the SUR circuit 16 in the normal operation can be stopped.

Figure 13:
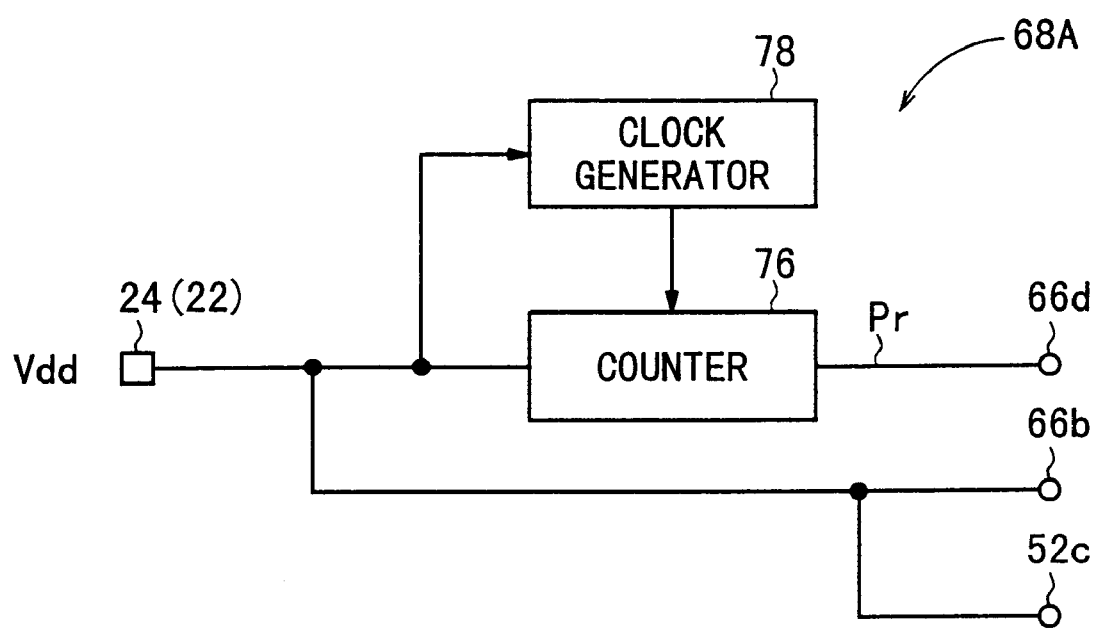
FIG. 13 is a circuit diagram showing the configuration of another power-on reset circuit.

FIG. 13 shows the configuration of another POR circuit 68A. The POR circuit 68A uses a preset down counter 76 in the form of a digital circuit. After the power supply is turned on, the counter 76 counts a preset number of clock pulses generated by a clock generator 78, and then generates a switching control signal Pr which rises to a high level H from a low level L (see FIG. 12). The POR circuit 68A as shown in FIG. 13 requires the clock generator 78 unlike the POR circuit 68 in the form of the analog circuit as shown in FIG. 11. However, the time to operate the SUR circuit 16 can be accurately measured based on the clock pulses, or the capacitor C, i.e., a large size, external attachment part such as an electrolytic capacitor can be advantageously omitted.

In place of the switch 66, the switching control signal Pr which is a power-on reset signal from the POR circuit 68 or 68A may be directly input to the SUR circuit 16 in order to stop the operation (stop the power consumption) in the internal circuit of the SUR circuit 16.

Figure 14:
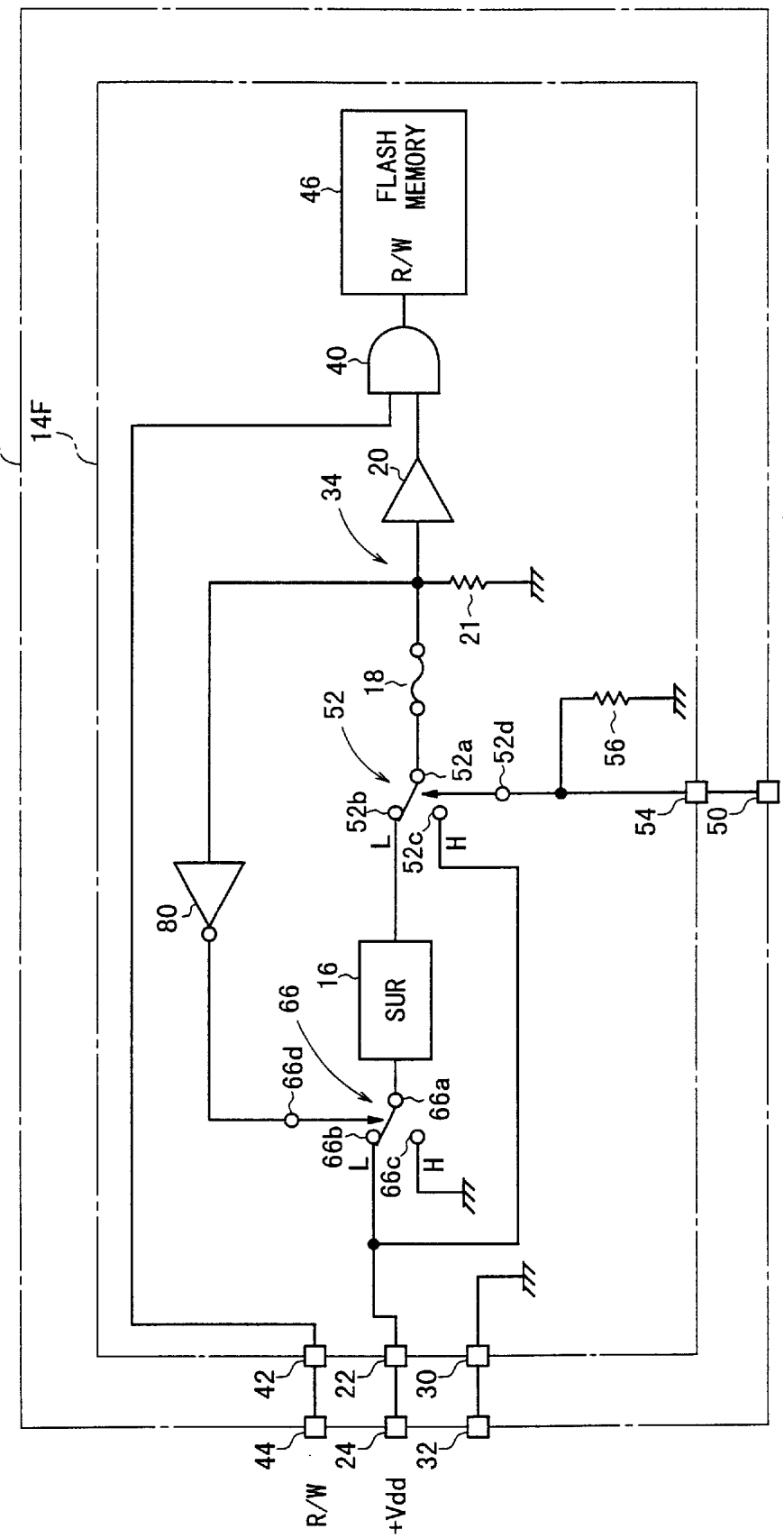
FIG. 14 is a circuit block diagram showing the configuration of another integrated circuit directed to saving of the power consumption after the disconnection of a fuse.

FIG. 14 shows an example of a circuit whose power consumption is further reduced. In the integrated circuit 10F as shown in FIG. 14, an inverter 80 forming a feedback loop is connected between the common connection node of the fuse 18 and the buffer 20 in the IC chip 14F stored in a package 12F and the switching control terminal 66d of the switch 66. During the period after the power supply Vdd is turned on and before the fuse 18 is blown, the power supply Vdd is supplied to the input node of the SUR circuit 16 through the fixed contact 66b and the common contact 66a, and a high voltage is applied to the fuse 18 from the SUR circuit 16.

When the fuse 18 is blown, the input node of the buffer 20, in other words, the input node of the inverter 80 has its level changed to a low level L by the function of the resistor 21, while the output level of the inverter 80 transits from a low level L to a high level H. The use of the feedback loop switches the switch 66 and after the fuse 18 is blown, the input node of the SUR circuit 16 is fixed to the ground level through the common contact 66a and the fixed contact 66c, so that the SUR circuit 16 is permanently stopped, and there will be no power consumption in the SUR circuit 16. Thus, the inverter 80 and the switch 66 serve as a power consumption limiting circuit to detect the blowing of the fuse 18 for reducing or eliminating the power consumption by the SUR circuit 16.

Note however that in the integrated circuit 10F as shown in FIG. 14, when the power supply Vdd is turned on, the SUR circuit 16 with relatively large power consumption operates before the fuse 18 is blown.

Figure 15:
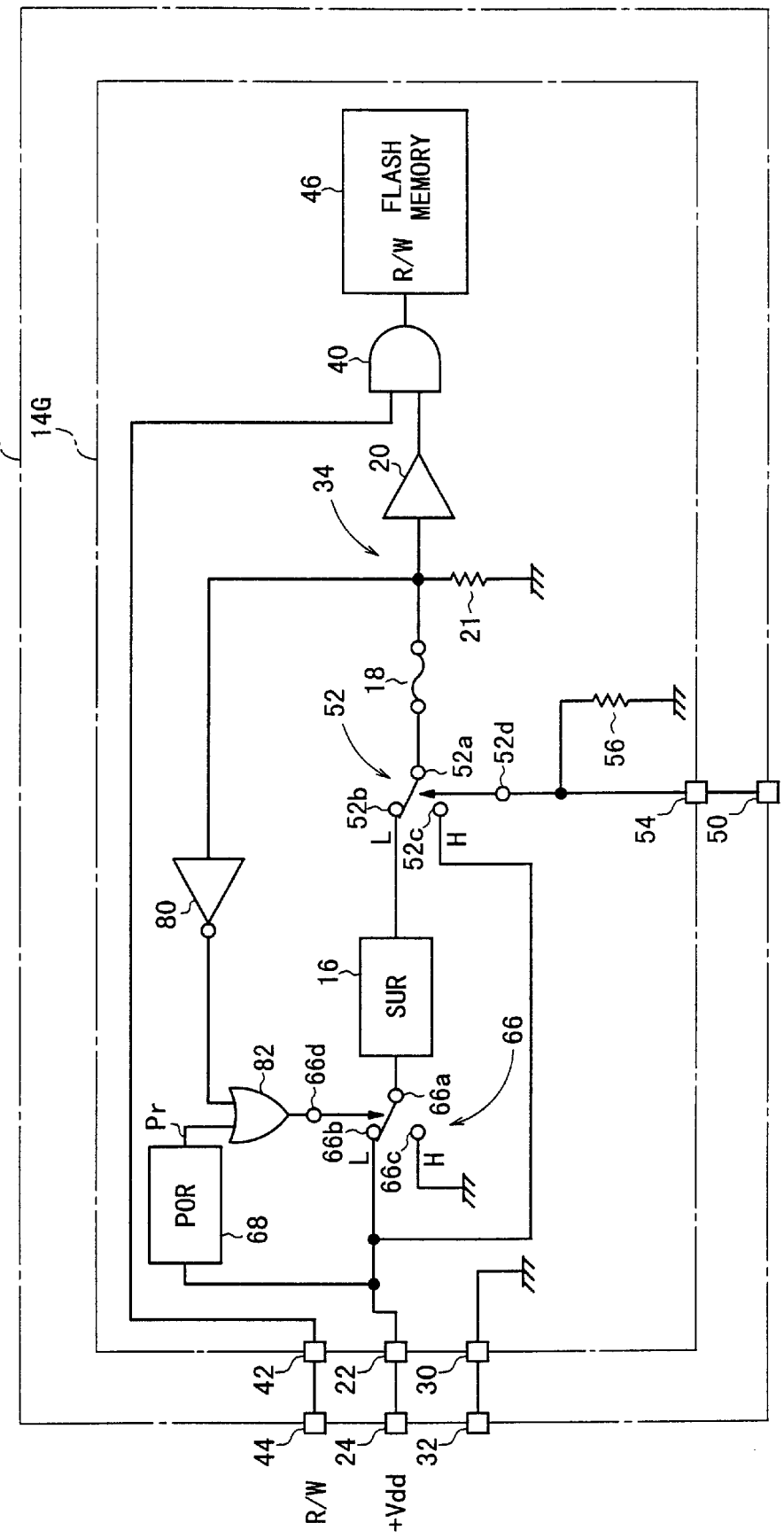
FIG. 15 is a circuit block diagram showing the configuration of an integrated circuit based on a combination of the circuits as shown in FIGS. 10 and 14.

In fact, the fuse 18 does not have to be blown by single passage of current, and may be blown by current passed for the second time or later. FIG. 15 shows a circuit satisfying the conditions both to limit the operation time of the SUR circuit 16 with relatively large power consumption and to permanently prevent the power supply Vdd from being supplied to the SUR circuit 16 once the fuse 18 is blown.

The integrated circuit 10G as shown in FIG. 15 includes the POR circuit 68 and the integrated circuit 10E shown in FIG. 10 and the inverter 80 shown in FIG. 14. An OR circuit 82 using the output of the POR circuit 68 and the output of the inverter 80 as two inputs and having an output connected to the switching control terminal 66d of the switch 66 is inserted.

In the integrated circuit 10G, during the power-on reset period Td, i.e., a prescribed time period when the power supply Vdd is turned on through the external power supply input terminal 24 provided at the package 12G, the fixed contact 66b of the switch 66 and the common contact 66a are connected under the control of the POR circuit 68, and the SUR circuit 16 operates similarly to the integrated circuit 10E as shown in FIG. 10 to supply fusing current to the fuse 18.

Once the fuse 18 is blown, the common contact 66a of the switch 66 is connected to the fixed contact 66c in the ground level by the high level H output of the inverter 80 forming the feedback loop right after the power supply Vdd is turned on, so that the SUR circuit 16 is prevented from being supplied with current. Thus, by the integrated circuit 10G as shown in FIG. 15, the power consumption can be reduced and the initial current passage period for the fuse 18 can be fixed.

It should be understood that the present invention is not limited to the above-described embodiments, but various forms may be employed without departing from the sprit and scope of the invention.

As in the foregoing, according to the present invention, when voltage is applied or current is supplied to a particular terminal of an electric/electronic circuit device, the logical output of the logical output setting circuit is irreversibly set to a prescribed logical output.

Therefore, the electric/electronic circuit device can be used with a simple structure to physically prevent hardware in electric/electronic products from being converted and software from being altered or subjected to secondary use.

Herein, if the particular terminal is a power supply input terminal for example, and the user uses it once in the field, a storage device for example included in the electric/electronic circuit device cannot be subjected to secondary use in the field.

More specifically, in a manufacturer which produces products having a storage device incorporating the electric/electronic circuit device according to present invention as LSI devices, program installation, chip shipment tests, operation tests for the products or the like can be performed to a storage device such as flash memory in the LSI by using a special jig according to the present invention. Meanwhile, presumably unlawful acts such as conversion of hardware such as LSI, alteration of software stored in a storage device, and secondary use thereof on the user side after the shipment into the market can be physically prevented. According to the present invention, such a mechanism can be incorporated into an electric/electronic circuit device.

What is claimed is:

1. An electric/electronic circuit device, comprising:
    a particular terminal;
    a logical output setting circuit connected to said particular terminal to set a logical output, said logical output setting circuit including a breaking element operable to irreversibly open based on a voltage initially applied to said particular terminal so that the logical output of said logical output setting circuit is irreversibly fixed to a prescribed logical output; and
    a boosting circuit provided between said particular terminal and said breaking element.

2. The electric/electronic circuit device according to claim 1, further comprising a power-on reset circuit to set said boosting circuit to an operation state for a prescribed time period after said voltage is applied to said particular terminal.

3. The electric/electronic circuit device according to claim 1, wherein
    said breaking element is opened by an output of said boosting circuit when said voltage is applied to said particular terminal, and
    said boosting circuit is connected with a power consumption limiting circuit to reduce or eliminate the power consumption by said boosting circuit in response to detection of the opening of said breaking element.

4. The electric/electronic circuit device according to claim 1, further comprising a power-on reset circuit to set said boosting circuit into an operation state for a prescribed time period after said voltage is applied to said particular terminal,
    said breaking element being opened by an output of said boosting circuit set to the operation state by said power-on reset circuit, and
    said boosting circuit being connected with a power consumption limiting circuit to reduce or eliminate the power consumption by said boosting circuit in response to detection of the opening of said breaking element.

5. The electric/electronic circuit device according to claim 1, wherein
    said electric/electronic circuit device is formed by an integrated circuit, and
    said breaking element is formed by a silicon interconnection pattern.

6. An electric/electronic circuit device, comprising:
    a power supply input terminal for said electric/electronic circuit device; and
    a logical output setting circuit connected to said power supply input terminal to set a logical output, the logical output of said logical output setting circuit being irreversibly fixed to a prescribed logical output once a voltage is initially applied to said power supply input terminal.

7. An electric/electronic circuit device, comprising:
    a logical output setting circuit having a logical output irreversibly fixed to a prescribed logical output once a voltage is initially applied to a power supply input terminal for said electric/electronic circuit device; and
    an electrically writable and eraseable storage device connected to the output side of the logical output setting circuit.

8. The electric/electronic circuit device according to claim 7, wherein
    an external terminal for reading/writing control is connected to a reading/writing control input of said storage device, and
    reading from and writing to said storage device can be controlled by using said external terminal for reading/ writing control before said voltage is applied to said power supply input terminal.

9. The electric/electronic circuit device according to claim 7, wherein an internal terminal for reading/writing control is connected to a reading/writing control input of said storage device, and reading from and writing to said storage device can be controlled by using said internal terminal for reading/writing control before said voltage is applied to said power supply input terminal.

10. The electric/electronic circuit device according to claim 7, wherein when said voltage is actually applied to said power supply input terminal, said storage device can be used only as a read only memory based on said fixed prescribed logical output of said logical output setting circuit.

11. An electric/electronic circuit device, comprising:

a logical output, setting circuit including a breaking element operable to irreversibly open based on a voltage initially applied to a particular external terminal so that a logical output of said logical output setting circuit is irreversibly fixed to a prescribed logical output;

an electrically writable and eraseable storage device connected to the output side of said logical output setting circuit; and a boosting circuit provided between said particular external terminal and said breaking element.

12. The electric/electronic circuit device according to claim 11, further comprising a power-on reset circuit to set said boosting circuit to an operation state for a prescribed time period after said voltage is applied to said particular external terminal.

13. The electric/electronic circuit device according to claim 11, wherein said breaking element is opened by an output of said boosting circuit when said voltage is applied to said particular external terminal, and said boosting circuit is connected with a power consumption limiting circuit to reduce or eliminate the power consumption by said boosting circuit in response to detection of the opening of the breaking element.

14. The electric/electronic circuit device according to claim 11, further comprising a power-on reset circuit to set said boosting circuit to an operation state for a prescribed time period after said voltage is applied to said particular external terminal, said breaking element is opened by an output of said boosting circuit set to an operation state by said power-on reset circuit, and said boosting circuit is connected with a power consumption limiting circuit to reduce or eliminate the power consumption by said boosting circuit in response to detection of the opening of said breaking element.

15. The electric/electronic circuit device according to claim 11, wherein said electric/electronic circuit device includes an integrated circuit, and said breaking element is formed by a silicon interconnection pattern.

* * * * *

UNITED STATES PATENT AND TRADEMARK OFFICE
CERTIFICATE OF CORRECTION

PATENT NO.     : 6,518,823 B1
DATED          : February 11, 2003
INVENTOR(S)    : Eiji Kawai It is certified that error appears in the above-identified patent and that said Letters Patent is hereby corrected as shown below:

Column 6,
Line 67, before the word "described" insert new paragraph and insert the word -- As --.

Column 9,
Line 56, after "respectively." insert new paragraph and insert -- The Schmitt trigger type buffer 73 can prevent the --.

Column 13,
Line 19, after "output" delete ",".

Column 14,
Line 18, "an" should read -- the --.

Signed and Sealed this

Sixteenth Day of December, 2003

JAMES E. ROGAN
*Director of the United States Patent and Trademark Office*